United States Patent [19]

Heller et al.

[11] Patent Number: 4,568,872
[45] Date of Patent: Feb. 4, 1986

[54] METHOD OF MEASURING THE DISTANCE OF A FAULT ON A LINE TAKING ACCOUNT OF DISTRIBUTED CAPACITANCES

[75] Inventors: Isabelle Heller, Sevres, France; Paul Loewenstein, Mountain View, Calif.

[73] Assignee: Enertec, Montrouge, France

[21] Appl. No.: 497,625

[22] Filed: May 24, 1983

[30] Foreign Application Priority Data

May 26, 1982 [FR] France .................. 82 09123

[51] Int. Cl.⁴ ............................................. H02H 7/26
[52] U.S. Cl. ..................................... 324/52; 361/82
[58] Field of Search ............. 324/51, 52; 361/82, 361/84, 85

[56] References Cited

U.S. PATENT DOCUMENTS

| | | | |
|---|---|---|---|
| 3,369,156 | 2/1968 | Souillard | 317/36 |
| 3,593,124 | 7/1971 | Cahen et al. | 324/52 |
| 3,612,989 | 10/1971 | Souillard et al. | 324/52 |
| 3,931,502 | 1/1976 | Kohlas | 235/151.31 |
| 3,983,377 | 9/1976 | Vitins | 235/151.31 |
| 4,063,162 | 12/1977 | Lanz | 324/52 |
| 4,251,766 | 2/1981 | Souillard | 324/52 |
| 4,313,169 | 1/1982 | Takagi et al. | 364/492 |
| 4,325,098 | 4/1982 | Heller | 361/82 |
| 4,371,907 | 2/1983 | Bignell | 361/82 |

FOREIGN PATENT DOCUMENTS 0053069 6/1982 European Pat. Off. .
1376746 9/1964 France .
2057232 5/1971 France .

OTHER PUBLICATIONS

Mathews: "Series–Compensated Line Protection with a Directional Comparison Scheme"—Developments in Power Systems Protection Conference in London--England, 1/10/80.

Primary Examiner—Stanley T. Krawczewicz
Assistant Examiner—Jose M. Solis
Attorney, Agent, or Firm—Dale Gaudier

[57] ABSTRACT

The invention concerns a method of direct measurement of a parameter characterizing a fault on an electricity line 1, such as the distance x or the resistance $R_d$ of the fault, the method being based on Ohm's Law including the line inductance L and the resistances R, $R_d$. The signals respectively associated with the variation of current i(t) and of voltage v(t) at the measuring point M are operated upon by transfer functions the ratio of which is equal to:

$$(2/\tau) \tan \omega\tau/2,$$

$\tau$ corresponding to the propagation time of a wave over double the distance between the measuring point M and a zone boundary P. The method thus takes into account the distributed capacitances C of the line.

6 Claims, 3 Drawing Figures

METHOD OF MEASURING THE DISTANCE OF A FAULT ON A LINE TAKING ACCOUNT OF DISTRIBUTED CAPACITANCES

BACKGROUND OF THE INVENTION

The present invention relates to a method for determining, at a measuring point on an electricity transmission network, the distance between this point and a fault affecting a line in the network the resistance and inductance per unit length of which are known, or for determining the resistance of this fault, comprising deriving instantaneous measurement signals of the voltage and current on the line, deriving, from these measurement signals, instantaneous processing signals of voltage and current related to the respective measurement signals by transfer functions, and giving the said distance or the said resistance the value which, for at least one group of simultaneous processing signals of voltage and current conforms to Ohm's Law applied to the line considered as resistive and inductive.

Methods of this type are known and examples are given of them in French Pat. Nos. 1 376 746 and 2 057 232, and in U.S. Pat. Nos. 3,369,156, 3,612,989 and 3,593,124.

In the classic forms of these earlier techniques, Ohm's Law is applied to the faulty line which is assumed to be an open circuit and exclusively resistive and inductive; there results an equation incorporating the two unknowns which are on the one hand the resistance of the fault and on the other hand the distance separating this fault from the measuring point.

The value of this distance is obtained either by using Ohm's Law, applied to the resistances and the inductance of the line, at the moment when the current in the faulty line is zero, which suppresses the effect of the fault resistance, or by using Ohm's Law for two groups of voltage and current measurement signals corresponding to different measurement instants.

These known methods, which have given full satisfaction, suffer however from a limitation which, in the present context of continuous increase in the length of lines, is becoming more and more inconvenient and which involves the fact that these methods take no account of the distributed capacitances of the electric lines.

However, if the distributed capacitances of the lines have been neglected up to now, it is because no way could be envisaged to take account of them without leading to a substantially increased complexity in the methods to be put into effect.

In this context, the object of the present invention is to provide a method which, without substantially increasing the complexity of previously mentioned known methods of distance measurement, enables the distributed capacitances of the line to be taken into account in the methods of direct measurement of the distance of a fault.

SUMMARY OF THE INVENTION

In the method according to this invention the ratio of the transfer function for the current processing signal associated with the inductance in Ohm's Law, to the transfer function for the voltage processing signal is at least substantially proportional to $$(2/\tau) \tan \omega\tau/2,$$

where $\tau$ corresponds to the real propagation time of an electric wave over double the distance separating the measuring point from a reference point on the line, and where $\omega$ is angular frequency, whereby there results at least a reduction in the error, in the determination of the distance of the fault, due to the existence of distributed capacitances on the line.

In one preferred implementation of the invention, the ratio of the transfer function for the current processing signal associated with the resistance in Ohm's Law, to the transfer function for the voltage processing signal is equal or close to unity.

In a particular implementation of the invention, each group of processing signals comprises a pair of voltage processing signals and a first and a second pair of current processing signals, the first respective signals of each pair corresponding to a first measuring instant, the second signals of each pair corresponding to a second measuring instant, and the time interval between the first and second instants corresponding to the said propagation time; the signals of the said pair of voltage processing signals are combined as an arithmetic mean to at least contribute to forming the term of Ohm's Law which is equivalent to a voltage.

Furthermore, the signals of the first pair of current processing signals are combined as a difference divided by the said propagation time to at least contribute to forming the term of Ohm's Law, equivalent to the time derivative of a current, which is associated with the inductance.

In one simple implementation of the invention, the signals of the second pair of current signals are combined as an arithmetic mean to at least contribute to forming the term of Ohm's Law, equivalent to a current, which is associated with the resistance.

In addition, for preference, the time interval separating the measuring instants characterising the signals for different pairs at least substantially corresponds to the propagation time of a wave over double the length of a zone of the line.

To understand the invention better, it is appropriate to recall that it falls within the scope defined at the beginning of the present discussion, and that therefore it does not amount to the use of current and voltage processing signals delayed, relative to other processing signals coincident with the measurement signals, by a time interval corresponding to the real propagation time of an electric wave over double a predetermined length of the line.

In fact, such a use, if considered in isolation, is described in U.S. Pat. No. 3,931,502. However, the method described in this earlier patent is not concerned, according to itself, with the direct measurement of the distance of a fault; more precisely, this earlier method aims to reproduce the electrical conditions prevailing at a reference point, with the object of formulating several equilibrium functions, the comparison of which ought to enable localisation of the fault.

The present invention, relating to the direct measurement of the distance of the fault, and having more general means of implementation and scope, is thus clearly distinguished from this earlier patent.

BRIEF DESCRIPTION OF THE DRAWING FIGURES

Other characteristics and advantages of the invention will appear from the description thereof which follows, by way of non-limitative example, with reference to the accompanying drawings, in which.

DESCRIPTION OF THE PREFERRED EMBODIMENT

Figure 1:
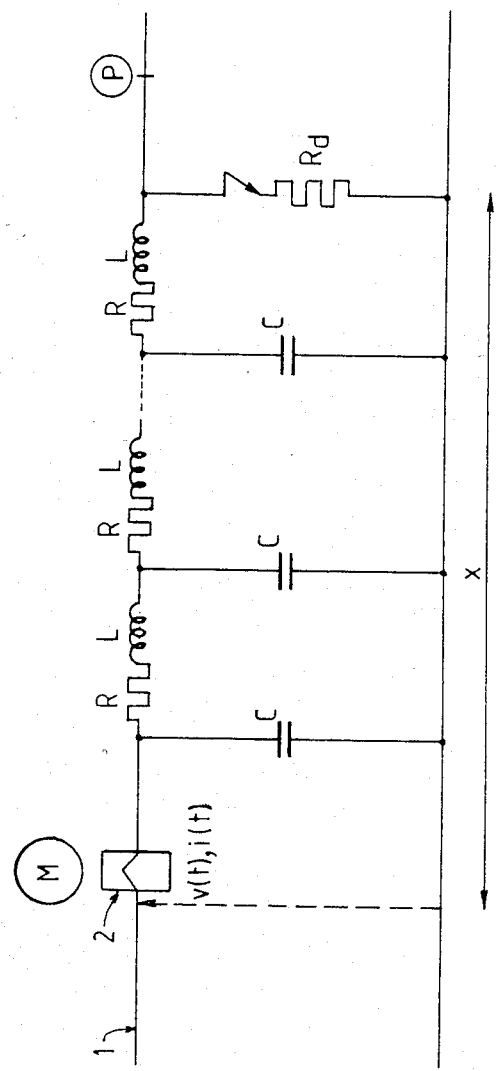
FIG. 1 is a diagram of a portion of a faulty line.

As explained in the preamble, the present invention concerns the direct measurement of the distance of a fault affecting an electric line, for example monophase or polyphase.

In traditional manner, the electric line 1 has at each end a relay 2 having in particular the function of supplying measurement signals of voltage and current appearing at each instant on the line at the point of installation M of this relay, or measuring point.

A relay installed on a polyphase line supplies at each instant as many voltage signals and current signals as the line has phases.

In accordance with known techniques, the method of the invention involves the generation, from the measurement signals, of voltage and current processing signals which, applied to Ohm's Law which the faulty line is supposed to obey and the resistance R and inductance L per unit length of which are known, lead to the determination of the distance of the fault. In known manner, the invention applies, formally at least, Ohm's Law restricted to resistances and the inductance.

To take account of the resistance $R_d$ of the fault, the hypothesis that the instantaneous fault current, i(t), is identical to the current appearing at the measuring point is also made; this latter hypothesis concerns the homopolar current in the case of a phase-to-earth fault on a polyphase line.

Thus, the present invention can be considered to be based, like the known methods of direct measurement of the distance of a fault, on the very general formulation of Ohm's Law:

$$v = x \cdot Ri + x \cdot L \frac{di}{dt} + R_d i \quad (1)$$

where v and i are the voltage and current measurement signals derived by the relay 2, x is the distance of the falt; and di/dt the time derivative of the current signal. The current processing signal di/dt is obtained from the current measurement signal i(t).

Now if we set $$L_E = x \cdot L,$$

and $$R_E = x \cdot R + R_d,$$

it can be seen that Ohm's Law is equally defined by the equation:

$$v = R_E \cdot i + L_E \cdot \frac{di}{dt} \quad (2)$$

The values of $R_E$ and $L_E$, and thus of x and $R_d$, can be derived by application of Ohm's Law at two different instants t and t', that is to say by the resolution of Cramer's system (3):

$$\begin{cases} v(t) = R_E \cdot i(t) + L_E \cdot \frac{di}{dt}(t) \\ v(t') = R_E \cdot i(t') + L_E \cdot \frac{di}{dt}(t') \end{cases}$$

It should be noted that the voltage and current signals v(t) and i(t) appearing in this system can be considered at one and the same time as measurement signals since they are directly representative of the voltage and current at the measurement point, and as processing signals since they are applied to Ohm's Law with a view to the measurement of the distance of the fault; as processing signals, v(t) and i(t) derive from the measurement signals by transfer functions obviously equal to unity.

It can also be noted that if measurement of the fault resistance $R_d$ is not necessary, the measurement of the distance x can be derived, in a still simpler manner, by the application of Ohm's Law at one instant $t_o$ such that $i(t_o)=0$; in effect, we then have the equation (4):

$$\frac{1}{X} = L \cdot \frac{di}{dt}(t_0)/v(t_0)$$

However, nothing in these known methods makes reference, even implicitly, to the distributed capacitances C of the line (FIG. 1), and it must be said that these ignored capacitances introduce an error in the measurement of x which cannot be negligible. In this context, the method of the invention, still based on formulations (1) and (2) of Ohm's Law, and looking to take the distributed capacitances of the line into account, essentially consists in that the ratio of the transfer function for the current processing signal associated with the inductance in Ohm's Law, to the transfer function for the voltage processing signal is at least substantially proportional to $(2/\tau) \tan \omega\tau/2$, where $\tau$ corresponds to the real propagation time of an electric wave over double the distance separating the measuring point from a reference point P on the line, and where $\omega$ is angular frequency; in addition, for preference, the ratio of the transfer function for the current processing signal associated with the resistance in Ohm's Law, to the transfer function for the voltage processing signal is equal or close to unity.

Explicitly, the invention can thus be considered as being based on the equation (5):

$$T_1 \cdot v = R_E \cdot T_2 \cdot i + L_E \cdot T_3 \cdot i$$

where $T_1$, $T_2$, $T_3$ are the transfer functions relating the voltage and current processing signals $T_1 \cdot v$, $T_2 \cdot i$, $T_3 \cdot i$ to the measured voltage and current signals v and i, and such that $T_3/T_1 = k \cdot (2/\tau) \tan \omega\tau/2$ and $T_2 = T_1$. For example, $T_2 = T_1 = (1 + \exp -j\omega\tau)/2$, and $T_3 = (1 - \exp -j\omega\tau)/\tau$, in which case the parameter k becomes the pure imaginary number j.

The introduction into the formulations (1) and (2) of Ohm's Law of the time interval $\tau$, which corresponds to a real propagation time, that is to say to a magnitude which depends on the distributed capacitances of the line, enables these capacitances to be taken into account in a simple and effective manner.

As a result there is a substantial reduction in the error in the measurement of the distance or the resistance of a fault, which is minimal for a fault appearing at the reference point P.

When the line is split into several zones, it is advantageous for the reference point P to coincide with a zone boundary.

The voltage and current processing signals $T_1 \cdot v$, $T_2 \cdot i$, $T_3 \cdot i$ can be obtained for example from the measurement signals v and i by means of a filtering operation known in itself, which it is thus not necessary to describe here, and can be used in place of the signals v(t), i(t), and di/dt in the expressions (3) or (4) to lead, as in the prior art, but with much better precision, to the determination of the distance of the fault.

In one particular implementation, the method of the invention essentially consists of using pairs of voltage processing signals and pairs of current processing signals, the first and second signals of each pair corresponding to different measurement instants separated by a time interval equal to the said real propagation time of an electric wave over double the distance separating the measurement point from a reference point P on the line.

In this particular form, the invention can thus be considered as being based on the equation (6) below:

$$[v(t)+v(t-\tau)]/2 = x \cdot R i(t) + x \cdot L[i(t) - i(t-\tau)]/\tau + R_d i(t)$$

in which appear the pairs of signals v(t), v(t−τ) and i(t), i(t−τ). In one simplified implementations, illustrated by FIGS. 2 and 3, the method of the invention can again be considered as being based on the equation:

$$[(t) + v(t - \tau)]/2 = x \cdot R[i(t) + i(t - \tau)]/2 + x \cdot L[i(t) - i(t - \tau)]/\tau + R_d[i(t) + i(t - \tau)]/2 \quad (7)$$

It should be noted that equation (7) corresponds to equation (5) written for the transfer functions $T_1 = T_2 = (1 + \exp -j\omega\tau)/2$ and $T_3 = (1 - \exp -j\omega\tau)/\tau$.

Figure 2:
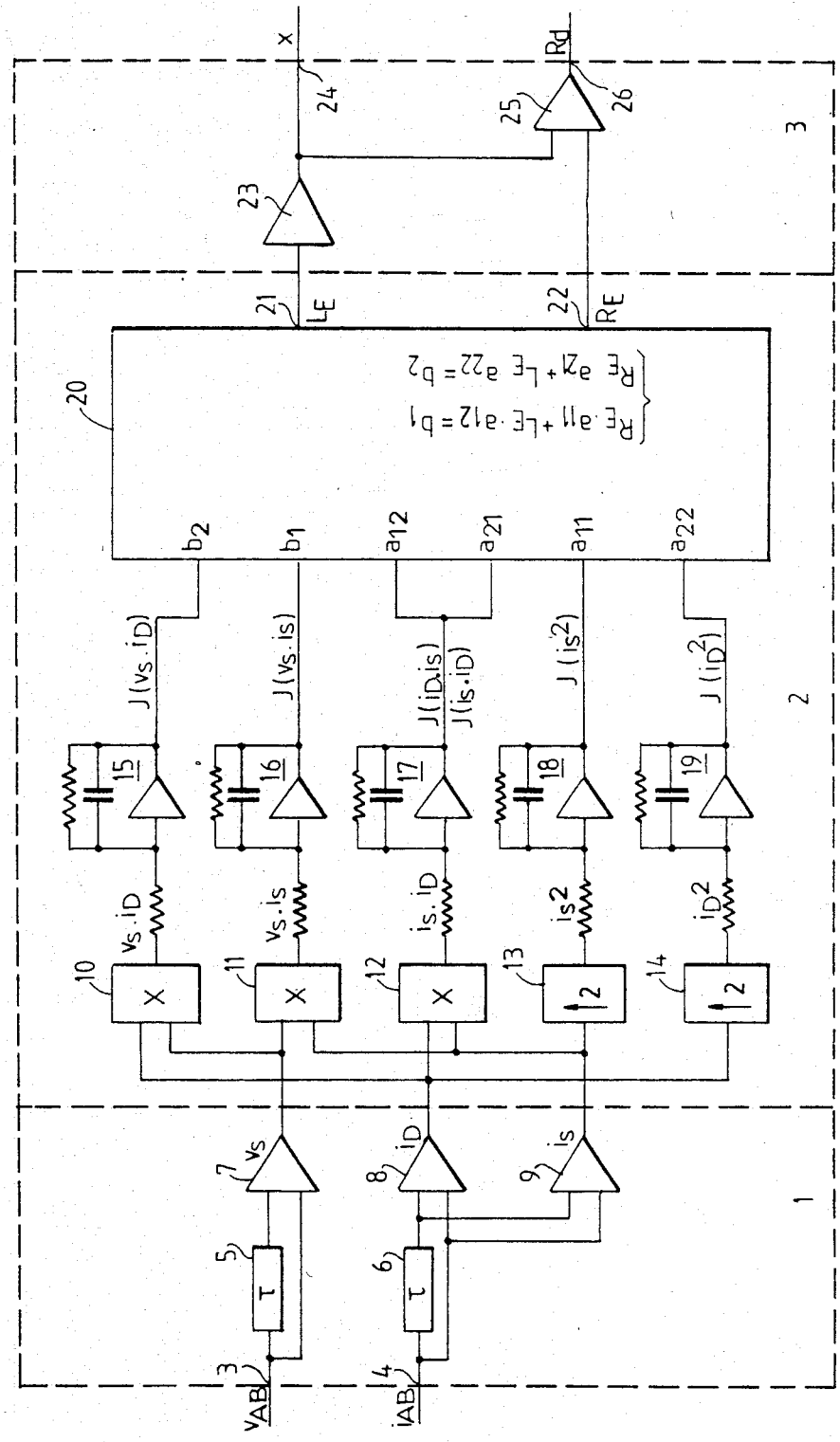
FIG. 2 is a diagram of an apparatus embodying the method of the invention for the case of a fault between phases on a polyphase line.

FIG. 2 relates to an apparatus and method for measuring the distance of a fault between the phases A and B of a three-phase line.

The apparatus shown receives measurement signals $v_{AB}$ and $i_{AB}$ of the voltage and current between phases on its inputs 3 and 4.

The delay circuits 5 and 6 delay the signals $v_{AB}$ and $i_{AB}$ respectively for a time interval τ equal to double the propagation time of an electric wave, in interphase mode, between the measuring point M and the reference point P.

The summing amplifiers 7, 8 and 9, coupled to the inputs 3, 4 and to the respective delay circuits 5, 6, derive respectively the signals $v_S$, $i_D$ and $i_S$ such that:

$$v_s = (\tfrac{1}{2}) \cdot [v_{AB}(t) - v_{AB}(t-\tau)]$$

$$i_D = (1/\tau) \cdot [i_{AB}(t) - i_{AB}(t-\tau)]$$

$$i_S = (\tfrac{1}{2}) \cdot [i_{AB}(t) + i_{AB}(t-\tau)]$$

The multipliers 10, 11, 12 coupled respectively to the outputs of the amplifiers 7 and 8, 7 and 9, and 8 and 9, derive the respective product signals $v_S \cdot i_D$, $v_S \cdot i_S$, and $i_S \cdot i_D$, while the squaring circuits 13 and 14, coupled respectively to the amplifiers 9 and 8, derive the respective signals $i_S^2$ and $i_D^2$.

The signals produced by the multipliers and the squaring circuits are integrated with respect to time in respective integrators 15 to 19 to form the integral signals:

$J(v_S \cdot i_D)$, $J(v_S \cdot i_S)$, $J(i_D \cdot i_S) = J(i_S \cdot i_D)$, $J(i_S^2)$, and $J(i_D^2)$.

These integral signals are supplied to a logic circuit 20, for example a computer, the outputs 21 and 22 of which supply respectively the signals $L_E$ and $R_E$ such that:

$$J(v_S \cdot i_S) = R_E \cdot J(i_S^2) + L_E \cdot J(i_D \cdot i_S),$$

and $$J(v_S \cdot i_D) = R_E \cdot J(i_S \cdot i_D) + L_E \cdot J(i_D^2).$$

The signal $L_E$ is supplied to an amplifier 23 which provides, at the output 24 of the apparatus, the signal $L_E/L = x$ representing the distance of the fault.

In addition, the amplifier 25, receiving the signals x and $R_E$, supplies at the output 26 of the apparatus the signal $R_E - x \cdot R = R_d$ representing the resistance of the fault.

It should be noted that the apparatus of FIG. 2 not only uses the pairs of processing signals $v_{AB}(t)$, $v_{AB}(t-\tau)$ and $i_{AB}(t)$, $i_{AB}(t-\tau)$ but in addition makes use, in the particular implementation of the invention which it forms, of the independence, in the linear algebra sense, of the signals $i_S$ and $i_D$, that is to say, specifically, of the signals $i_{AB}(t)$ and $i_{AB}(t-\tau)$.

Figure 3:
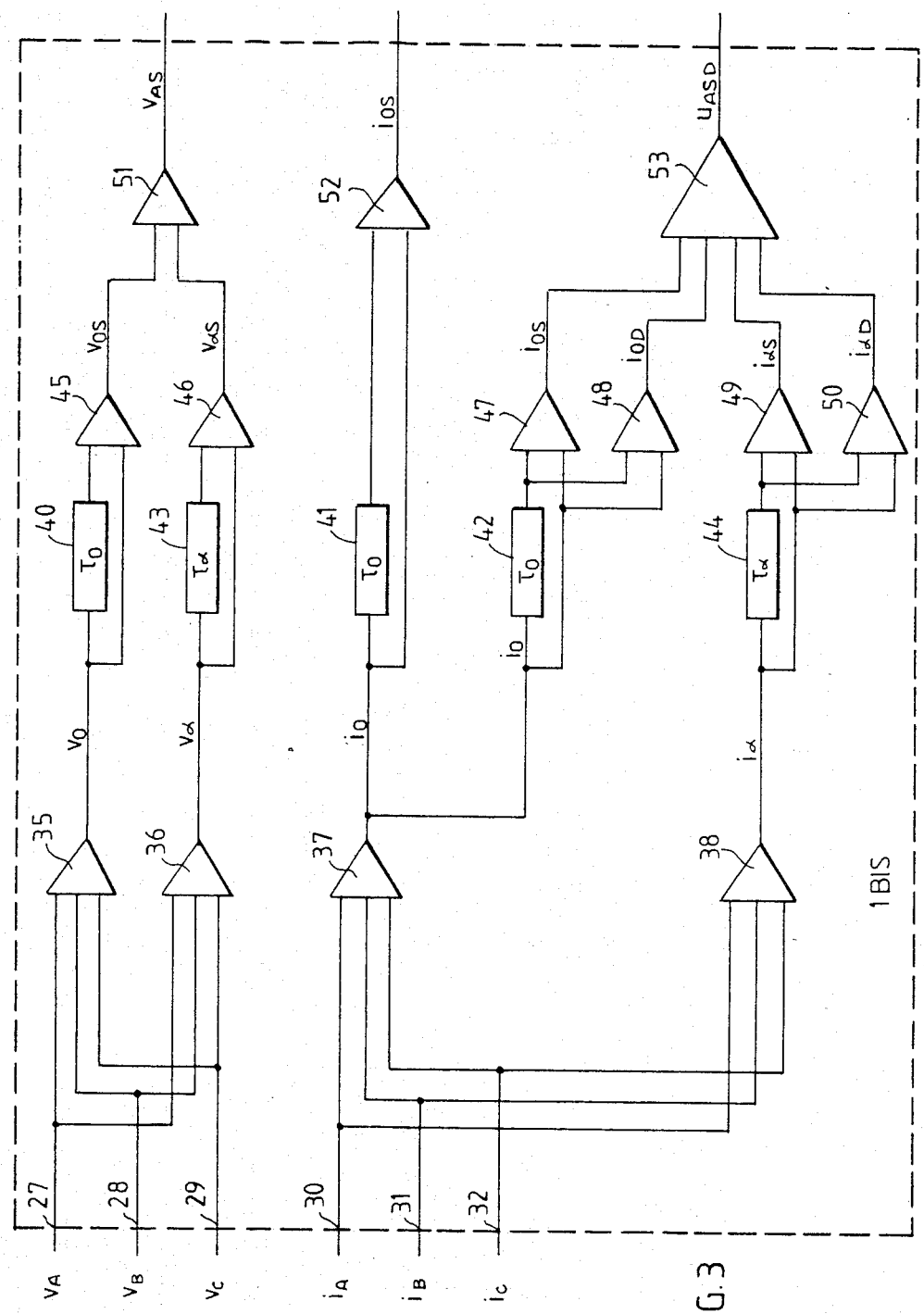
FIG. 3 is a partial diagram of an apparatus embodying the method of the invention for the case of a fault between one phase and neutral.

FIG. 3 relates to the first stage of an apparatus for measuring the distance of a fault between the phase A of a three-phase line and earth.

This stage, referenced 1 BIS because it can, in accordance with the description hereinafter, replace the stage 1 of the apparatus of FIG. 2, receives on its inputs 27, 28 and 29, the voltage measurement signal $V_A$, $V_B$, $V_C$ of the three phases of the line, and on its inputs 30, 31 and 32, the current measurement signals $i_A$, $i_B$, $i_C$ of the three phases.

The summing amplifier 35, coupled to the inputs 27, 28 and 29, derives the homopolar voltage signal $$v_o = (v_A + v_B + v_C)/3$$

The summing amplifier 36, coupled to the inputs 27, 28 and 29, derives the signal $v\alpha$, representing the Clarke or two-wire component α, of the voltage, given by:

$$v_\alpha = (2v_A - v_B - v_C)/3$$

The summing amplifier 37, coupled to the inputs 30, 31 and 32, derives the homopolar current signal:

$$i_o = (i_A + i_B + i_C)/3$$

Finally the summing amplifier 38, coupled to the inputs 30, 31 and 32, derives the signal $i_\alpha$, representing the Clarke or two-wire component α, of the current given by:

$$i_\alpha = (2i_A - i_B - i_C)/3$$

Three delay circuits 40 on the one hand, and 41, 42 on the other hand, are coupled respectively to the outputs of the amplifiers 35 and 37, to introduce a delay $\tau_o$ equal to double the propagation time of an electric wave, in homopolar mode, between the measuring point and the reference point.

Two other delay circuits 43 and 44 are coupled respectively to the outputs of the amplifiers 36 and 38, to introduce a delay $\tau_\alpha$ equal to double the propagation time of an electric wave, in two-wire mode, between the measuring point and the reference point.

A summing amplifier 45, coupled to the output of the amplifier 35 and of the delay circuit 40, derives a signal $v_{oS}$ given by:

$$v_{oS}=[v_o(t)+v_o(t-\tau_o)]/2$$

A summing amplifier 46, coupled to the output of the amplifier 36 and of the delay circuit 43, derives a signal $v_{\alpha S}$ given by:

$$v_{\alpha S}=[v_\alpha(t)+v_\alpha(t-\tau_\alpha)]/2$$

A summing amplifier 47, coupled to the output of the amplifier 37 and of the delay circuit 42, derives a signal $i_{oS}$ given by:

$$i_{oS}=[i_o(t)+i_o(t-\tau_o)]/2$$

A summing amplifier 48, coupled to the output of the amplifier 37 and of the delay circuit 42, derives a signal $i_{oD}$ given by:

$$i_{oD}=[i_o(t)-i_o(t-\tau_o)]/\tau_o$$

A summing amplifier 49, coupled to the output of the amplifier 38 and of the delay circuit 44, derives a signal $i_{\alpha S}$ given by:

$$i_{\alpha S}=[i_\alpha(t)+i_\alpha(t-\tau_\alpha)]/2$$

A summing amplifier 50, coupled to the output of the amplifier 38 and of the delay circuit 44, derives a signal $i_{\alpha D}$ given by:

$$i_{\alpha D}=[i_\alpha(t)-i_\alpha(t-\tau_\alpha)]/\tau_\alpha$$

A summing amplifier 51, coupled to the outputs of the amplifiers 45 and 46, derives a signal $V_{AS}$ given by:

$$v_{AS}=(v_{oS}+v_{\alpha S})/2$$

A summing amplifier 52, coupled to the output of the amplifier 37 and of the delay circuit 41, derives a signal $i_{oS}$ given by:

$$i_{oS}=[i_o(t)+i_o(t-\tau_o)]/2$$

Finally, a summing amplifier 53, coupled to the outputs of the amplifiers 47 to 50, derives a signal $u_{ASD}$ given by:

$$u_{ASD}=R_o \cdot i_{oS}+R_\alpha \cdot i_{\alpha S}+L_o \cdot i_{oD}+L_\alpha \cdot i_{\alpha D}$$

where $R_o$ and $L_o$ are the homopolar resistance and inductance per unit length of the line, and where $R_\alpha$ and $L_\alpha$ are the two-wire resistance and inductance per unit length of the line.

As Ohm's Law applied to the faulty line leads to the expression:

$$v_{AS}=x \cdot u_{ASD}+3R_d \cdot i_{oS},$$

it is sufficient to connect the amplifiers 51, 52 and 53 of the apparatus of FIG. 2 to stage 2 of the apparatus of FIG. 1, in place of the amplifiers 7, 9 and 8, respectively, to obtain directly, on the outputs 21 and 22 of the logic circuit 20, the signals x and $3 \cdot R_d$ representing respectively the distance of the fault and triple the resistance of the fault.

Like the apparatus described in relation to a fault between phases, this preceding apparatus uses pairs of voltage processing signals, such as $v_o(t)$, $v_o(t-\tau_o)$, and $v_\alpha(t)$, $v_\alpha(t-\tau_\alpha)$ as well as pairs of current processing signals, such as $i_o(t)$, $i_o(t-\tau_o)$, and $i_\alpha(t)$ and $i_\alpha(t-\tau_\alpha)$; in addition, this last apparatus also makes advantageous use, in stage 2, of the linear independence of the signals of the different pairs.

We claim:

1. A method of determining at least the distance between a measuring point and a fault on a line of an electrical transmission network or the resistance of the fault, where the resistance, R, and inductance, L, per unit length of the network are known, comprising the steps of:
   (a) measuring the voltage and current on the line at the measurement point and generating signals indicative thereof;
   (b) generating a voltage processing signal related to the voltage indicative signal by a first transfer function, and generating first and second current processing signals respectively related to the current indicative signal by second and third transfer functions, wherein the ratio of the second to the first transfer function is substantially equal to 1 and wherein the ratio of the third to the first transfer function is substantially equal to $(2/\tau) \tan \omega\tau/2$, where $\tau$ corresponds to the propagation time of an electric wave over twice the distance separating the measuring point and a reference point on the line, and where $\omega$ is the angular frequency of the voltage and current indicative signals; and
   (c) calculating at least the resistance $R_d$ of the fault, or the distance x of the fault from the measurement point, according to the equation:

$$E=(x \cdot R+R_d) \cdot I_1+(x \cdot L) \cdot I_2$$

where E is the voltage processing signal, and $I_1$ and $I_2$ are respectively the first and second current processing signals.

2. Method according to claim 1, wherein each group of processing signals comprises a pair of voltage processing signals and a first and a second pair of current processing signals, the first respective signals of each pair corresponding to a first measuring instant, the second signals of each pair corresponding to a second measuring instant, and the time interval between the first and second instants corresponding to said propagation time.

3. Method according to claim 2, wherein said signals of said pair of voltage processing signals are combined as an arithmetic mean to form a signal which is representative of the term of said equation which is equivalent to a voltage.

4. Method according to claim 2, wherein said signals of said first pair of current processing signals are combined as a difference divided by said propagation time to form a signal which is representative of the term of said equation, equivalent to the time derivation of a current, which is associated with the inductance.

5. Method according to claim 2, wherein said signals of said second pair of current signals are combined as an arithmetic mean to form a signal which is representative of the term of said equation, equivalent to a current, which is associated with the resistance.

6. Method according to claim 1, applied to a line divided into zones, wherein said distance separating the measuring point from said reference point on the line is substantially equal to the length of a zone.

* * * * *